(12) United States Patent
Li et al.

(10) Patent No.: US 10,088,375 B2
(45) Date of Patent: Oct. 2, 2018

(54) THIN FILM MATERIAL RESIDUAL STRESS TESTING STRUCTURE AND METHOD

(71) Applicant: Southeast University, Nanjing (CN)

(72) Inventors: Weihua Li, Nanjing (CN); Lei Wang, Nanjing (CN); Lu Zhang, Nanjing (CN); Zaifa Zhou, Nanjing (CN)

(73) Assignee: Southeast University, Nanjing (CN)

( * ) Notice: Subject to any disclaimer, the term of this patent is extended or adjusted under 35 U.S.C. 154(b) by 120 days.

(21) Appl. No.: 15/104,095

(22) PCT Filed: May 5, 2015

(86) PCT No.: PCT/CN2015/078243
§ 371 (c)(1),
(2) Date: Jun. 13, 2016

(87) PCT Pub. No.: WO2015/184946
PCT Pub. Date: Dec. 10, 2015

(65) Prior Publication Data
US 2018/0164164 A1 Jun. 14, 2018

(30) Foreign Application Priority Data
Jun. 3, 2014 (CN) .......................... 2014 1 0243181

(51) Int. Cl.
*G01L 1/00* (2006.01)
*G01L 1/08* (2006.01)
(Continued)

(52) U.S. Cl.
CPC ............ *G01L 1/086* (2013.01); *G01L 5/0047* (2013.01); *H01L 22/34* (2013.01)

(58) Field of Classification Search
CPC ........ G01L 1/086; G01L 5/0047; H01L 22/34
See application file for complete search history.

(56) References Cited

U.S. PATENT DOCUMENTS

| 6,606,913 B1* | 8/2003 | Gianchandani .......... G01B 7/22 73/777 |
| 2002/0054424 A1* | 5/2002 | Miles ..................... B82Y 20/00 359/291 |
| 2005/0263760 A1* | 12/2005 | Langer .................. G01L 5/0047 257/48 |

FOREIGN PATENT DOCUMENTS

| CN | 101051018 A | 10/2007 |
| CN | 102565143 A | 7/2012 |
(Continued)

OTHER PUBLICATIONS

ISA/CN, International Search Report issued on PCT application No. CN2015/078243, dated Aug. 11, 2015, 2 pages.
(Continued)

*Primary Examiner* — Blake A Tankersley
(74) *Attorney, Agent, or Firm* — Greenberg Traurig, LLP

(57) ABSTRACT

A thin film material residual testing structure comprises two groups of structures. The first group of structures comprises an electrostatic driven polysilicon cantilever beam, an asymmetrical cross beam made of thin film material to be tested and having an alignment structure, and a double-end fixed support beam made of the thin film material to be tested. The second group of structures is similar to the structure of the first group with the fixed support beam removed. A residual stress testing method includes separating the loading drive part of force from a residual stress testing structure made of the thin film material to be tested, designing the bending deflection of a control testing structure according to geometrical parameters, extracting the force applied on the residual stress testing structure and utilizing force and deflection to calculate the residual stress of the thin film material to be tested.

2 Claims, 1 Drawing Sheet

(51) Int. Cl.
G01L 5/00 (2006.01)
H01L 21/66 (2006.01)

(56) References Cited

FOREIGN PATENT DOCUMENTS

| | | |
|---|---|---|
| CN | 202502063 U | 10/2012 |
| CN | 103196592 A | 7/2013 |
| CN | 103439031 A | 12/2013 |
| CN | 104034449 A | 9/2014 |
| WO | 9623205 A1 | 8/1996 |

OTHER PUBLICATIONS

JW LAW, document of English Abstracts of the Chinese publications listed under the Foreign Patent Documents section of this IDS, 3 pages.

* cited by examiner

THIN FILM MATERIAL RESIDUAL STRESS TESTING STRUCTURE AND METHOD

CROSS REFERENCE TO RELATED APPLICATION

The present application is a 371 U.S. National Stage of International Application No. PCT/CN2015/078243, filed May 5, 2015, which claims the benefit of the earlier filing date of Chinese Patent Application No. 201410243181.0 filed on Jun. 3, 2014, which are each incorporated herein by reference in their entirety.

TECHNICAL FIELD

The invention provides a testing structure for residual stress of a film material and belongs to the technical field of parameter testing of micro electro mechanical system (MEMS) material.

BACKGROUND

The performance of a micro electro mechanical system is closely related to the material parameter. Due to the effect in processing, some material parameters change, and these uncertain factors caused by the processing technique resulted in uncertainty and instability of the device design and performance prediction. The material parameter testing is aimed to real-time measure the material parameter of the micro electro mechanical device manufactured by a specific process, monitor stability of the process and feed the parameter back to the designer in order to modify the design. Therefore, testing using general equipment without leaving the processing environment becomes a necessary measure for process monitoring. The physical parameters of the material mechanical properties mainly include residual stress, Young's modulus, Poisson's ratio, and the breaking strength, etc.

The film material is widely used in the micro electro mechanical device structure, especially in the surface micromachining structure, and the film material is the primary material of the structural materials. Currently, most online testing structures for material parameter are directed to conductive materials, such as doped monocrystalline silicon, doped polycrystalline silicon and metals, etc. For the insulating materials, such as silicon nitride, silicon dioxide and silicon dioxide-wrapped monocrystalline silicon or polycrystalline silicon, it is not easy to realize direct loading and electrical detection of the testing signal due to insulating properties of these materials.

SUMMARY

Technical Problem generally, measuring the residual stress of the material needs to know the stress size of the structure and a deformation or bending deflection caused by the stress of the structure. The invention provides a testing structure for measuring residual stress of a film material. The testing structure consists of two groups of structures: one group is used for measuring reference data, i.e., the size of the applied force when the structure has a certain bending deflection; and the other group is used for measuring the size of the applied force under the same bending deflection condition after adding a residual stress testing unit. The two applied forces are subtracted to obtain the force value actually acted on the residual stress testing structure, and according to this value and the bending deflection, as well as the geometric dimension of the testing structure, etc., the residual stress of the film material can be calculated.

Technical Solution in order to realize the abovementioned object, the technical solution used in the invention is as follows:

The actual structure for testing the residual stress is a double-end clamped beam made of the film material to be tested. A polycrystalline silicon cantilever beam driven by electrostatic force forms an acting force source. A non-symmetrical cross beam having an alignment structure made of the film material to be tested serves as a deflection measuring unit, a vertical short beam of the cross beam serves as a rotating shaft, two ends of the vertical short beam are connected with an anchor area, the left side and right side of the central position of the vertical short beam are provided with a horizontal long beam respectively, and the two horizontal long beams have different lengths, which aims to improve the deflection measuring accuracy by using the proportional amplifying principle. An alignment structure is arranged on the longer end of the long beam.

Both the center of the clamped beam and the end of the shorter long beam of the cross beam are placed below the end of the polycrystalline silicon cantilever beam, the polycrystalline silicon cantilever beam is pulled down by the electrostatic force generated by the applied voltage, and meanwhile the center of the clamped beam and the end of the shorter long beam of the cross beam move downward. The driving ends when the alignment structure on the longer end of the long beam of the cross beam is aligned. At this time, the electrostatic force includes three parts: the force required by driving the polycrystalline silicon cantilever beam to bend downward; the force required by turning the cross beam; and the force required by bending the clamped beam downward.

The clamped beam for actually measuring the residual stress is removed, so that only the polycrystalline silicon cantilever beam and the cross beam are left to form another set of testing structure. The polycrystalline silicon cantilever beam achieves the same deflection by using the same electrostatic force driving method. The electrostatic force at this time is calculated according to the size of the applied voltage and the deflection.

The two measured electrostatic force values are subtracted, and the difference between the electrostatic forces is the force required by driving the clamped beam to achieve the set deflection. The residual stress of the film material to be tested can be calculated according to the size of the force, the deflection and the geometric dimension of the clamped beam, etc.

According to the abovementioned technical solution, the invention provides a testing structure for measuring residual stress of a film material. The testing structure consists of two groups of structures: the first group of structures includes a polycrystalline silicon cantilever beam driven by electrostatic force, a non-symmetrical cross beam having an alignment structure made of the film material to be tested and a double-end clamped beam made of the film material to be tested; and the second group of structures is the remaining structures of the first group of structures excluding the clamped beam;

The polycrystalline silicon cantilever beam of the first group of structures is formed by connecting a first anchor area, a thin long beam, a wide beam served as an upper electrode, and a thin short beam from left to right. A rectangular lower electrode is located on the lower surface of the wide beam. An air layer is located between the wide beam and the lower electrode. A first salient point and a second salient point on the lower surface of the thin short beam served as force points of the clamped beam and the cross beam, respectively;

The clamped beam of the first group of structures is formed by connecting a second anchor area, a third anchor area and a long beam. The clamped beam is vertical to the polycrystalline silicon cantilever beam. The center of the clamped beam is located below the first salient point on the left of the polycrystalline silicon cantilever beam;

The cross beam of the first group of structures consists of a fourth anchor area, a fifth anchor area, a first vertical short beam, a left long beam and a right long beam having different lengths and an alignment structure, wherein, two ends of the first vertical short beam are connected with the fourth anchor area and the fifth anchor area respectively. The left long beam and the right long beam are arranged on the left and right sides of the central position of the first vertical short beam. The length from the center of the first vertical short beam to the second salient point is L2, the length from the center of the vertical short beam to B side of the vertical beam is L1, and L1 is greater than L2. The right end of the right long beam is connected with the alignment structure. The alignment structure consists of a second vertical short beam, a third vertical short beam and a sixth anchor area, wherein the second vertical short beam is connected with the right end of the right long beam to establish a vertical relationship, and one end of the third vertical short beam is connected with the sixth anchor area. The aligned sides of the alignment structure are A side of the third vertical short beam and B side of the second vertical short beam, and a small distance Δ exists between A and B sides. The horizontal axis of the cross beam and the horizontal axis of the polycrystalline silicon cantilever beam are coincided with each other.

The testing method of the testing structure for residual stress of the film material in the invention is: extracting the electrostatic force required when the center of the clamped beam is driven to reach the testing deflection, by using the principle that the same parts of the first and second groups of structures are subjected to the same stress under the same testing deflection;

The testing deflection of the center of the clamped beam is controlled by setting the distance Δ, L1 and L2; and when A is aligned with B, the deflection in the position of the second salient point at the center of the clamped beam $$= \frac{\sqrt{L1^2 - (L1 - \Delta)^2}}{L1} \times L2$$

The electrostatic force F1 of the first group of structures under the testing deflection includes three parts: the force required by driving the polycrystalline silicon cantilever beam to bend, the force required by turning the cross beam, and the force required by bending the clamped beam;

The electrostatic force F2 of the second group of structures under the testing deflection includes two parts: the force required by driving the polycrystalline silicon cantilever beam to bend and the force required by turning the cross beam;

Subtracting F2 from F1 obtains the net force required by separately driving the clamped beam to reach the testing deflection.

Beneficial Effects the invention has the following beneficial effects compared with prior art:

The invention provides a testing structure for residual stress of a film material, which can be used for testing residual stresses of a conductive film material and an insulating film material. In the invention, a loading drive part of force is separated from a residual stress testing structure made of the film material to be tested. The bending deflection of the testing structure is controlled by the geometric parameter design. The force acting on the residual stress testing structure is extracted according to the principle that the same parts of the two groups of testing structures are subjected to the same stress. The residual stress of the insulating film material is calculated by using the force and the deflection. The testing structure, the measuring method and the method for parameter extraction of the invention are very simple and can be used for testing residual stresses of various film materials, such as conductor/insulator.

The biggest advantages of the invention are simple testing method for the residual stress of the film material, low requirements for the testing equipment and stable testing process and testing parameter values. The processing and the micro electromechanical device are synchronous without any special processing requirements and are completely conform to the requirements for online testing. The calculation method is limited only to simple mathematical formula. The testing structure, the measuring method and the calculation method for parameter extraction of the invention are very simple, have wide adaptability and can be used for testing residual stresses of conductive and insulating film materials.

DETAILED DESCRIPTION

Figure 1:
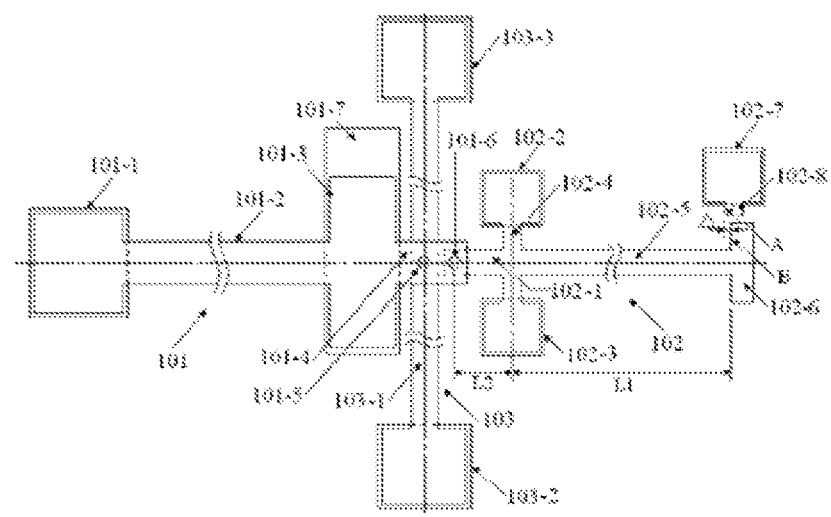
FIG. 1 is a first group of structures of the invention.
Figure 2:
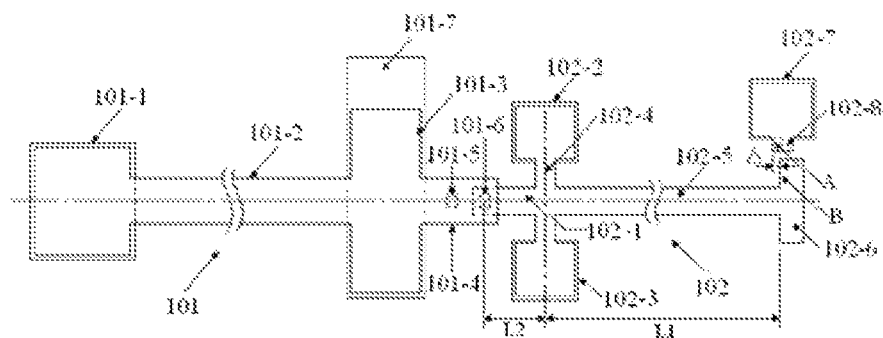
FIG. 2 is a second group of structures of the invention.
In the drawings: polycrystalline silicon cantilever beam 101; cross beam 102; clamped beam 103;
first anchor area 101-1; thin long beam 101-2; wide beam 101-3; thin short beam 101-4; first salient point 101-5; second salient point 101-6; lower electrode 101-7;
long beam 103-1; second anchor area 103-2; third anchor area 103-3;
left long beam 102-1; fourth anchor area 102-2; fifth anchor area 102-3; first vertical short beam 102-4; right long beam 102-5; second vertical short beam 102-6; sixth anchor area 102-7; and third vertical short beam 102-8.

The invention is further illustrated below in conjunction with FIG. 1 and FIG. 2.

The invention provides a testing structure for measuring residual stress of a film material. The testing structure consists of two groups of structures, as shown in FIG. 1 and FIG. 2, respectively. The first group of structures shown in FIG. 1 includes a polycrystalline silicon cantilever beam 101 driven by electrostatic force, a non-symmetrical cross beam 102 having an alignment structure made of the film material to be tested and a double-end clamped beam 103 made of the film material to be tested; and the second group of structures shown in FIG. 2 includes a polycrystalline silicon cantilever beam 101 and a cross beam 102. The second group of structures is the remaining structures of the first group of structures excluding the clamped beam 103.

The polycrystalline silicon cantilever beam 101 of the first group of structures is formed by connecting a first anchor area 101-1, a thin long beam 101-2, a wide beam 101-3 served as an upper electrode, and a thin short beam 101-4 from left to right; a rectangular lower electrode 101-7 is located on the lower surface of the wide beam 101-3; an air layer is located between the wide beam 101-3 and the lower electrode 101-7; and a first salient point 101-5 and a second salient point 101-6 on the lower surface of the thin short beam 101-4 served as force points of the clamped beam 103 and the cross beam 102, respectively;

The clamped beam 103 in the first group of structures is formed by connecting a second anchor area 103-2, a third anchor area 103-3 and a long beam 103-1; the clamped beam 103 is vertical to the polycrystalline silicon cantilever beam 101; and the center of the clamped beam 103 is located below the first salient point 101-5 on the left of the polycrystalline silicon cantilever beam 101;

The cross beam 102 in the first group of structures consists of a fourth anchor area 102-2, a fifth anchor area 102-3, a first vertical short beam 102-4, a left long beam 102-1 and a right long beam 102-5 having different lengths and an alignment structure, wherein two ends of the first vertical short beam 102-4 are connected with the fourth anchor area 102-2 and the fifth anchor area 102-3 respectively; the left long beam 102-1 and the right long beam 102-5 are arranged on the left and right sides of the central position of the first vertical short beam 102-4; the length from the center of the first vertical short beam 102-4 to the second salient point 101-6 is L2, the length from the center of the vertical short beam 102-4 to B side of the vertical beam 102-6 is L1, and L1 is greater than L2; the right end of the right long beam 102-5 is connected with the alignment structure; the alignment structure consists of a second vertical short beam 102-6, a third vertical short beam 102-8 and a sixth anchor area 102-7, wherein the second vertical short beam 102-6 is connected with the right end of the right long beam 102-5 to establish a vertical relationship, and one end of the third vertical short beam 102-8 is connected with the sixth anchor area 102-7; the aligned sides of the alignment structure are A side of the third vertical short beam 102-8 and B side of the second vertical short beam 102-6, and a small distance Δ exists between A and B sides; and the horizontal axis of the cross beam 102 and the horizontal axis of the polycrystalline silicon cantilever beam 101 are coincided with each other.

The testing method of the testing structure for residual stress of the film material of the invention is: extracting the electrostatic force required when the center of the clamped beam 103 is driven to reach the testing deflection, by using the principle that the same parts of the first and second groups of structures are subjected to the same stress under the same testing deflection;

The testing deflection of the center of the clamped beam 103 is controlled by setting the distance Δ, L1 and L2; and when A is aligned with B, the deflection in the position of the second salient point 101-6 at the center of the clamped beam $$103 = \frac{\sqrt{L1^2 - (L1 - \Delta)^2}}{L1} \times L2.$$

The electrostatic force F1 of the first group of structures under the testing deflection includes three parts: the force required by driving the polycrystalline silicon cantilever beam 101 to bend, the force required by turning the cross beam 102, and the force required by bending the clamped beam 103;

The electrostatic force F2 of the second group of structures under the testing deflection includes two parts: the force required by driving the polycrystalline silicon cantilever beam 101 to bend and the force required by turning the cross beam 102;

Subtracting F2 from F1 obtains the net force required by separately driving the clamped beam 103 to reach the testing deflection.

The second group of structures is the remaining structures of the first group of structures excluding the clamped beam 103 and has the same unit structure and size as that of the corresponding units of the first group of structures.

The testing principle for the residual stress of the film material is as follows:

First, the first group of structures is tested. A gradually increasing voltage is applied between the upper and lower polar plate wide beam 101-3 and 101-7 of the polycrystalline silicon cantilever beam 101. The right end of the polycrystalline silicon cantilever beam 101 is driven to bend downward by the electrostatic force generated by the voltage. Meanwhile, the center of the clamped beam 103 and the left end of the cross beam 102 is pressed to move downward via the first salient point 101-5 and the second salient point 101-6, and force the cross beam 102 to turn around the first vertical short beam 102-4 served as an axis, which causes the right long beam 102-5 to warp upward and shortens the projection length of the right long beam 102-5, and B side gradually approaches A side, and the voltage increase is stopped and the voltage value V1 is recorded when B side is aligned with A side. The testing deflection required to achieve during the testing process can be simply controlled by setting the values Δ, L1 and L2. When A is aligned with B, the deflection (testing deflection) in the position of the second salient point 101-6 at the center of the clamped beam 103 is:

$$\frac{\sqrt{L1^2 - (L1 - \Delta)^2}}{L1} \times L2$$

The electrostatic force F1 at this time can be calculated by the deflection and the applied voltage value V1. F1 includes three parts: the force required by bending the polycrystalline silicon cantilever beam 101; the force required by turning the cross beam 102; and the force required by bending the clamped beam 103.

Then, the second group of structures is tested. Similarly, a gradually increasing voltage is applied between the upper and lower polar plate wide beam 101-3 and the lower electrode 101-7 such that the right end of the polycrystalline silicon cantilever beam 101 is bent downward. Meanwhile, the left end of the cross beam 102 is pressed to move downward via the second salient point 101-6, and forces the cross beam 102 to turn around the first vertical short beam 102-4 served as an axis, which causes the right long beam 102-5 to warp upward. The voltage increase is stopped and the voltage value V2 is recorded when B side is aligned with A side. The electrostatic force F2 at this time can be calculated by the applied voltage value V2 and the moving distance (deflection). F2 includes two parts: the force required by bending the driving beam 101; and the force required by turning the cross beam 102.

Subtracting F2 from F1 obtains the net force required by separately driving the clamped beam 103 to reach the set deflection. The residual stress of the film material can be calculated by the value of the force and the deflection at the center of the clamped beam 103.

The above mentioned are only preferred embodiments of the invention. It is noted that, for those of ordinary skill in the art, various improvements and modifications can be made without departing from the principle of the invention. These improvements and modifications are also construed as the scope of protection of the invention.

We claim:

1. A testing structure for residual stress of a film material, comprising:
    a first group of structures comprises a polycrystalline silicon cantilever beam driven by electrostatic force, a non-symmetrical cross beam having an alignment structure made of the film material to be tested and a double-end clamped beam made of the film material to be tested; and
    a second group of structures comprises a polycrystalline silicon cantilever beam driven by electrostatic force, and a non-symmetrical cross beam having an alignment structure made of the film material to be tested;
    the polycrystalline silicon cantilever beam of the first group of structures is formed by connecting a first anchor area, a thin long beam, a wide beam served as an upper electrode, and a thin short beam from left to right;
        a rectangular lower electrode is located on the lower surface of the wide beam;
        an air layer is located between the wide beam and the lower electrode; and
        a first salient point and a second salient point on the lower surface of the thin short beam served as force points of the clamped beam and the cross beam, respectively;
    the clamped beam of the first group of structures is formed by connecting a second anchor area, a third anchor area and a long beam;
        the clamped beam is vertical to the polycrystalline silicon cantilever beam; and
        the center of the clamped beam is located below the first salient point on the left of the polycrystalline silicon cantilever beam;
    the cross beam in the first group of structures comprises a fourth anchor area, a fifth anchor area, a first vertical short beam, a left long beam and a right long beam having different lengths, and an alignment structure, wherein two ends of the first vertical short beam are connected with the fourth anchor area and the fifth anchor area, respectively;
    the left long beam and the right long beam are arranged on the left and right sides of the central position of the first vertical short beam;
    the length from the center of the first vertical short beam to the second salient point is L2, the length from the center of the vertical short beam to B side of the vertical beam is L1, and L1 is greater than L2;
    the right end of the right long beam is connected with the alignment structure;
    the alignment structure comprises a second vertical short beam, a third vertical short beam and a sixth anchor area, wherein the second vertical short beam is connected with the right end of the right long beam to establish a vertical relationship, and one end of the third vertical short beam is connected with the sixth anchor area;
    the aligned sides of the alignment structure are A side of the third vertical short beam and B side of the second vertical short beam, and a small distance $\Delta$ exists between A and B sides; and
    the horizontal axis of the cross beam and the horizontal axis of the polycrystalline silicon cantilever beam are coincided with each other.

2. A testing method of the testing structure for residual stress of a film material according to claim 1, wherein the electrostatic force required when the center of a clamped beam is driven to reach the testing deflection is extracted, by using the principle that the same parts of first and second groups of structures are subjected to the same stress under the same testing deflection;
    the testing deflection of the center of the clamped beam is controlled by setting a distance $\Delta$, L1 and L2; and when A is aligned with B, the deflection in the position of a second salient point at the center of the clamped beam $$= \frac{\sqrt{L1^2 - (L1 - \Delta)^2}}{L1} \times L2;$$

an electrostatic force F1 of the first group of structures under the testing deflection comprises three parts: the force required by driving a polycrystalline silicon cantilever beam to bend, the force required by turning a cross beam, and the force required by bending the clamped beam;
    an electrostatic force F2 of the second group of structures under the testing deflection comprises two parts: the force required by driving the polycrystalline silicon cantilever beam to bend and the force required by turning the cross beam;
    subtracting F2 from F1 obtains the net force required by separately driving the clamped beam to reach the testing deflection.

* * * * *